（12） United States Patent
Lee et al.

(10) Patent No.: US 8,125,236 B2
(45) Date of Patent: Feb. 28, 2012

(54) MAIN BOARD AND SYSTEM FOR MEMORY MOUNTING TEST

(75) Inventors: Jung-Kuk Lee, Yongin-si (KR); Seung-Hee Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 12/662,015

(22) Filed: Mar. 29, 2010

(65) Prior Publication Data

US 2010/0257416 A1 Oct. 7, 2010

(30) Foreign Application Priority Data

Apr. 1, 2009 (KR) .................. 10-2009-0028027

(51) Int. Cl.
*G01R 31/00* (2006.01)
*G01R 31/306* (2006.01)

(52) U.S. Cl. ................... 324/756.02; 324/763.01

(58) Field of Classification Search ............ 324/756.01–756.07, 762.01, 763.01–763.02
See application file for complete search history.

(56) References Cited

U.S. PATENT DOCUMENTS 6,462,532 B1 * 10/2002 Smith ............... 324/750.27
(Continued)

FOREIGN PATENT DOCUMENTS

JP 05-029538 2/1993
(Continued)

*Primary Examiner* — Huy Q Phan
*Assistant Examiner* — Joshua Benitez
(74) *Attorney, Agent, or Firm* — Harness, Dickey & Pierce, P.L.C.

(57) ABSTRACT

A main board according to example embodiments may include a substrate and at least one socket. The at least one socket may directly connect a memory module to the substrate in a direction parallel to the substrate. A memory mounting test system including the main board may occupy a smaller space, because the memory module is connected to the main board in a direction parallel to the main board.

9 Claims, 13 Drawing Sheets

U.S. PATENT DOCUMENTS

| | | | |
|---|---|---|---|
| 6,469,496 B1 * | 10/2002 | Khouw et al. | 324/750.25 |
| 6,476,628 B1 * | 11/2002 | LeColst | 324/754.14 |
| 6,975,130 B2 * | 12/2005 | Yevmenenko | 324/750.01 |
| 2006/0220671 A1 * | 10/2006 | Devey et al. | 324/771 |
| 2011/0016269 A1 * | 1/2011 | Lee et al. | 711/105 |

FOREIGN PATENT DOCUMENTS

| | | |
|---|---|---|
| KR | 96-24608 | 7/1996 |
| KR | 10-0549425 | 1/2006 |
| KR | 10-0818621 | 3/2008 |

\* cited by examiner

MAIN BOARD AND SYSTEM FOR MEMORY MOUNTING TEST

CROSS-REFERENCE TO RELATED APPLICATION

This application claims priority under 35 USC §119 to Korean Patent Application No. 2009-0028027, filed on Apr. 1, 2009 in the Korean Intellectual Property Office (KIPO), the contents of which are herein incorporated by reference in their entirety.

BACKGROUND

1. Technical Field

Example embodiments relate to a memory test system, for example, a main board for a memory mounting test and a memory mounting test system having the main board.

2. Description of the Related Art

A test for a semiconductor device may be performed by connecting the semiconductor device to an automatic test equipment (ATE), applying a predetermined signal pattern to the semiconductor device, and analyzing output signals of the semiconductor device. As capacity and operating speed of a semiconductor device increase, the cost for testing the semiconductor device also increases. Because the test is not performed under a real usage condition but, rather, is performed under a particular designed test condition, an accurate test for the semiconductor device is relatively difficult.

To perform a mounting test for a memory module under a real usage condition, the memory module may be tested while it is mounted on a main board or a mother board. In the mounting test for a memory module, a dynamic random access memory (DRAM) module used in a personal computer may be mounted on the main board, and a test program designed with consideration of a real operating condition may be performed. When the personal computer operates normally, it may be determined that the memory module has not failed. On the other hand, when the personal computer operates abnormally, it may be determined that the memory module has failed. However, such a mounting test for a memory module of relatively high capacity in a system level requires increased time and costs.

SUMMARY

Example embodiments relate to a main board for a memory mounting test as well as a memory mounting test system including the main board. A main board according to example embodiments may include a substrate and at least one socket. The at least one socket may be configured to connect the memory module to the substrate in a direction parallel to the substrate. The at least one socket may be connected to an end portion of the substrate.

The main board may further include a central processing unit, a memory controller, and/or an input and output control circuit. The central processing unit, memory controller, and/or input and output control circuit may be on a front surface of the substrate. The at least one socket may be connected to the front surface of the substrate. Alternatively, the at least one socket may be connected to a back surface of the substrate, the back surface being opposite to the front surface. The at least one socket may also include a first socket and a second socket. The first socket may be connected to the front surface of the substrate and the second socket may be connected to a back surface of the substrate, the back surface being opposite to the front surface.

The main board may further include a central processing unit, a memory controller, an input and output control circuit, and/or an interface circuit configured to interface with external devices, and the substrate may include a first substrate portion and a second substrate portion. The first substrate portion may include the at least one socket, the central processing unit, the memory controller, and the input and output control circuit. The second substrate portion may include the interface circuit which interfaces with external devices.

A memory mounting test system according to example embodiments may include a plurality of main boards and a test circuit. Each of the plurality of main boards may include a substrate and a socket configured to connect a memory module to the substrate in a direction parallel to the substrate. The test circuit may be electrically connected to the plurality of main boards and configured to perform a mounting test for memory modules by applying an address signal, a control signal, and/or a data signal to the plurality of main boards.

The memory modules may have two or more ranks but may be configured as having one rank during the mounting test. The memory module may include a first input, a second input, a third input, and a fourth input. The first input and second input may be connected to each other, and the third input and fourth input may be connected to each other during a rank parallel test board (PTB) mode. The first input may be connected to a first rank and configured to receive a chip selection signal for the first rank, the second input may be connected to a second rank and configured to receive a chip selection signal for the second rank, the third input may be connected to the first rank and configured to receive a clock enable signal for the first rank, and the fourth input may be connected to the second rank and configured to receive a clock enable signal for the second rank during a normal mode.

The memory module may further include a fifth input and a sixth input. The fifth input and sixth input may be connected to each other during the rank PTB mode. The fifth input may be connected to the first rank and configured to receive an on die termination signal for the first rank and the sixth input may be connected to the second rank and configured receive an on die termination signal for the second rank during the normal mode.

During the rank PTB mode, one of the fifth input and sixth input may be connected to ground. The fifth input may be connected to the first rank and configured to receive an on die termination signal for the first rank, and the sixth input may be connected to the second rank and configured to receive an on die termination signal for the second rank during the normal mode.

Another memory mounting test system according to example embodiments may include a plurality of main boards and a plurality of power supplies. Each of the plurality of main boards may include a substrate, a connector, and a socket configured to connect a memory module to the substrate in a direction parallel to the substrate. The connector may be configured to receive an address signal, a control signal, and/or a data signal from external devices for performance of a mounting test for memory modules. The plurality of power supplies may be configured to provide power to the plurality of main boards. Each of the plurality of power supplies may be connected to at least one (e.g., two or more) of the plurality of main boards.

The memory module may have two or more ranks but may be configured as having one rank during the mounting test. The memory module may include a first input, a second input, a third input, and a fourth input. The first input and second input may be connected to each other, and the third input and fourth input may be connected to each other during a rank PTB mode. The first input may be connected to a first rank and configured to receive a chip selection signal for the first rank, the second input may be connected to a second rank and configured to receive a chip selection signal for the second rank, the third input may be connected to the first rank and configured to receive a clock enable signal for the first rank, and the fourth input may be connected to the second rank and configured to receive a clock enable signal for the second rank during a normal mode.

The memory module may further include a fifth input and a sixth input. The fifth input and sixth input may be connected to each other during the rank PTB mode. The fifth input may be connected to the first rank and configured to receive an on die termination signal for the first rank, and the sixth input may be connected to the second rank and configured to receive an on die termination signal for the second rank during the normal mode.

During the rank PTB mode, one of the fifth input and sixth input may be connected to ground. The fifth input may be connected to the first rank and configured to receive an on die termination signal for the first rank, and the sixth input may be connected to the second rank and configured to receive an on die termination signal for the second rank during the normal mode.

BRIEF DESCRIPTION OF THE DRAWINGS

Illustrative, non-limiting example embodiments may be more clearly understood when the following detailed description is read in conjunction with the accompanying drawings.

DETAILED DESCRIPTION

Figure 1:
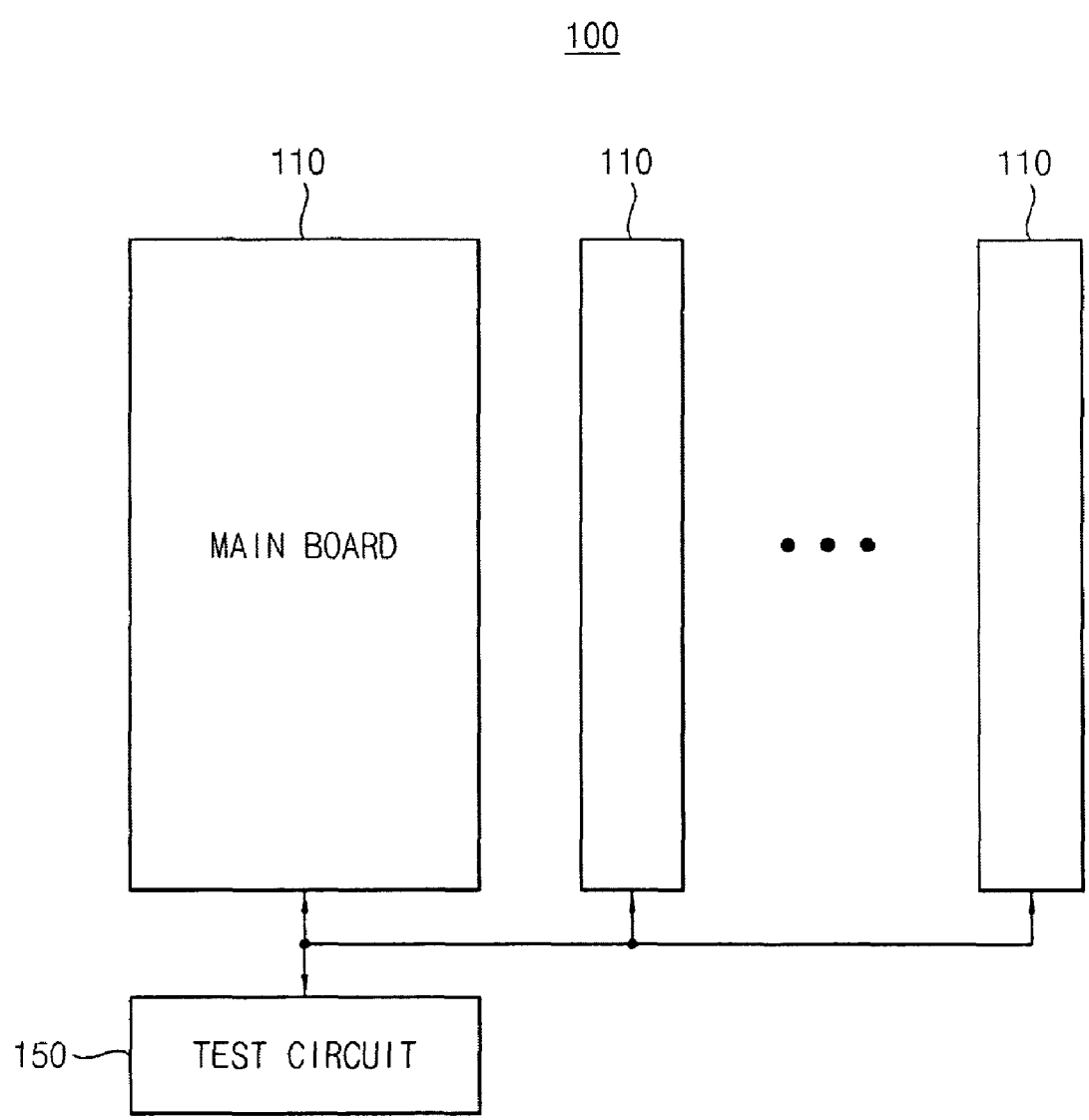
FIG. 1 is a diagram illustrating a memory mounting test system according to example embodiments.

Various example embodiments will be described more fully below with reference to the accompanying drawings. However, it should be understood that the present inventive concept may be embodied in many different forms and should not be construed as limited to the embodiments set forth herein. Rather, the non-limiting embodiments have merely been provided to ensure the thoroughness and completeness of the disclosure and to more fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory mounting test system according to example embodiments. Referring to FIG. 1, a memory mounting test system 100 may include a plurality of main boards 110 and a test circuit 150. As will be described below, each of the plurality of main boards 110 may include a socket directly connecting a memory module to a substrate in a direction parallel to the substrate. The test circuit 150 may provide an address signal, a control signal, and/or a data signal to the plurality of main boards 110 to which memory modules are electrically connected and tests the memory modules to determine whether the memory modules have failed or not. The memory mounting test system 100 of FIG. 1 may occupy a relatively small space, because the memory modules are connected to the plurality of main boards 110, respectively, in a direction parallel to the main boards.

Figure 2:
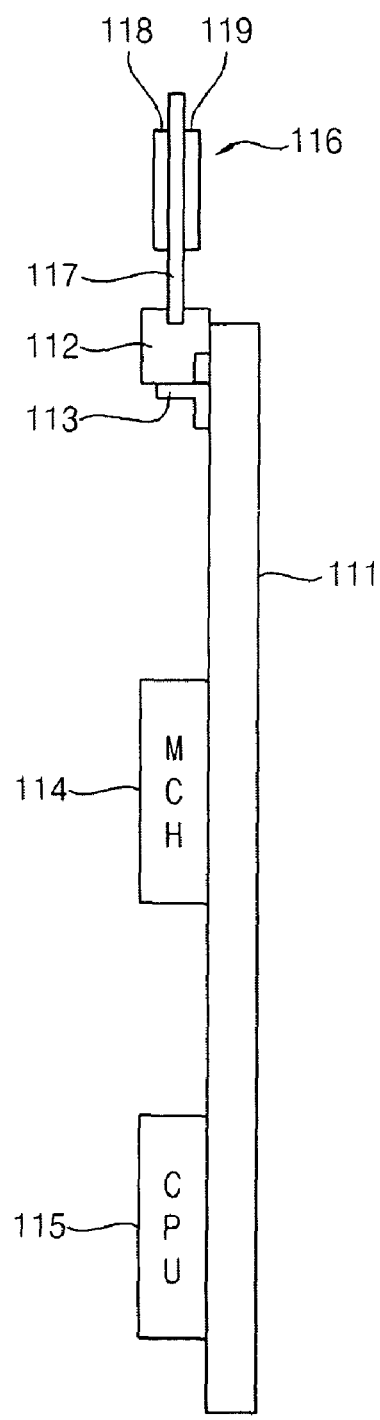
FIG. 2 is a side view of a main board that may be included in the memory mounting test system of FIG. 1.

FIG. 2 is a side view of a main board that may be included in the memory mounting test system of FIG. 1. Referring to FIG. 2, a main board 110a may include a first substrate 111 and a first socket 112 directly connecting a first memory module 116 to the first substrate 111 in a direction parallel to the first substrate 111. The first substrate 111 may include a printed circuit board. The first socket 112 may be electrically connected to the first substrate 111 through a first metal line 113. The first memory module 116 may include a second substrate 117 and memory chips 118 and 119 disposed on each side of the second substrate 117. The main board 110a may further include a memory controller MCH 114 and a central processing unit CPU 115 on a front surface of the first substrate 111. The first socket 112 may be connected to the front surface of the first substrate 111. The first socket 112 may also be connected to an upper portion of the first substrate 111 so that the first memory module 116 may be connected with greater ease to the first socket 112 for a mounting test. Although not shown, the main board 110a may further include additional circuits, e.g., an input and output control circuit and/or an interface circuit.

Figure 3:
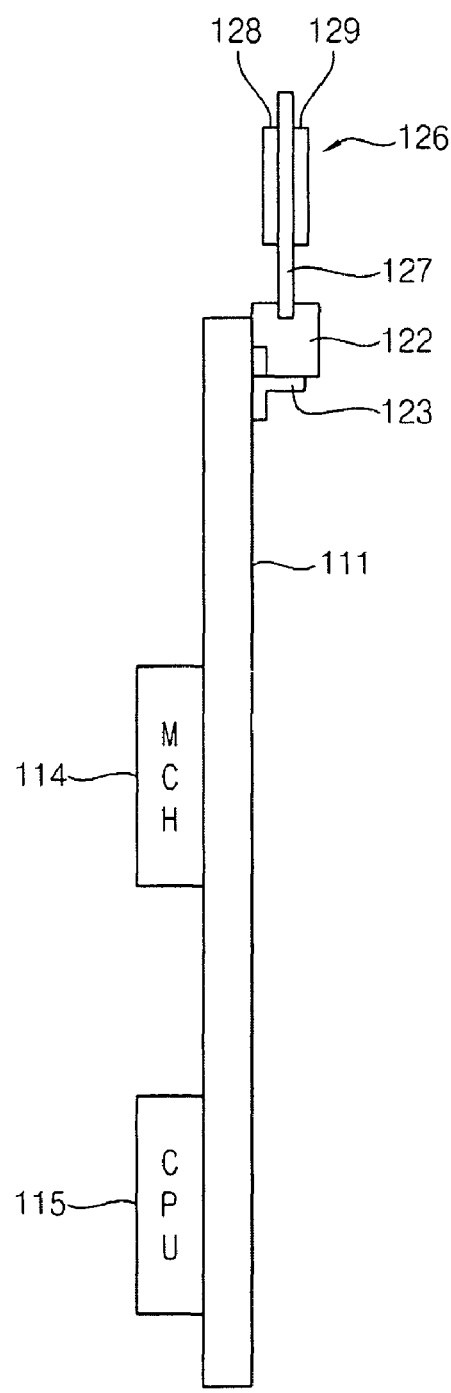
FIG. 3 is a side view of another main board that may be included in the memory mounting test system of FIG. 1.

FIG. 3 is a side view of another main board that may be included in the memory mounting test system of FIG. 1. Referring to FIG. 3, a main board 110b may include the first substrate 111 and a second socket 122 directly connecting a second memory module 126 to the first substrate 111 in a direction parallel to the first substrate 111. The first substrate 111 may include a printed circuit board. The second socket 122 may be electrically connected to the first substrate 111 through a second metal line 123. The second memory module 126 may include a third substrate 127 and memory chips 128 and 129 disposed on each side of the third substrate 127. The main board 110b may further include the memory controller MCH 114 and the central processing unit CPU 115 on the front surface of the first substrate 111. The second socket 122 may be connected to a back surface of the first substrate 111, which is the opposite surface of the front surface. The second socket 122 may also be connected to an upper portion of the first substrate 111 so that the second memory module 126 may be connected with greater ease to the second socket 122 for a mounting test. The main board 110b may further include additional circuits, e.g., an input and output control circuit and/or an interface circuit, although not shown in FIG. 3.

Figure 4:
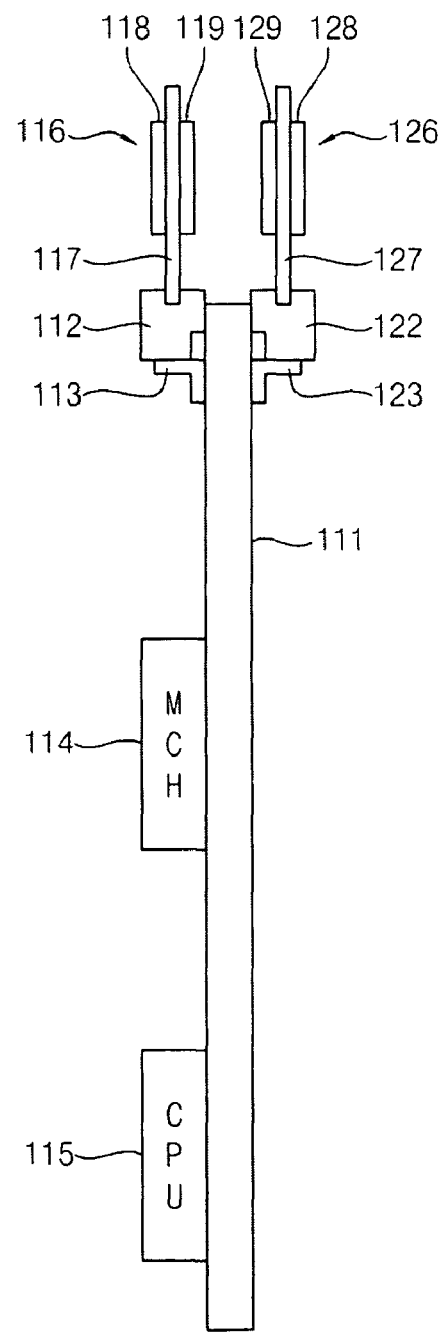
FIG. 4 is a side view of another main board that may be included in the memory mounting test system of FIG. 1.

FIG. 4 is a side view of another main board that may be included in the memory mounting test system of FIG. 1. Referring to FIG. 4, a main board 110c may include the first substrate 111, the first socket 112 directly connecting the first memory module 116 to the first substrate 111 in a direction parallel to the first substrate 111, and the second socket 122 directly connecting the second memory module 126 to the first substrate 111 in a direction parallel to the first substrate 111. The first substrate 111 may include a printed circuit board. The first socket 112 may be electrically connected to the first substrate 111 through the first metal line 113, and the second socket 122 may be electrically connected to the first substrate 111 through the second metal line 123. The first memory module 116 may include the second substrate 117 and the memory chips 118 and 119 disposed on each side of the second substrate 117, and the second memory module 126 may include the third substrate 127 and the memory chips 128 and 129 disposed on each side of the third substrate 127. The main board 110c may further include the memory controller MCH 114 and the central processing unit CPU 115 on the front surface of the first substrate 111. The first socket 112 may be connected to the front surface of the first substrate 111, and the second socket 122 may be connected to the back surface of the first substrate 111, which is the opposite surface of the front surface. The first socket 112 and the second socket 122 may also be connected to an upper portion of the first substrate 111 so that the first memory module 116 and the second memory module 126 may be connected with greater ease to the first socket 112 and the second socket 122, respectively, for a mounting test. Although not shown, the main board 110c may further include additional circuits, e.g., an input and output control circuit and/or an interface circuit.

Figure 5:
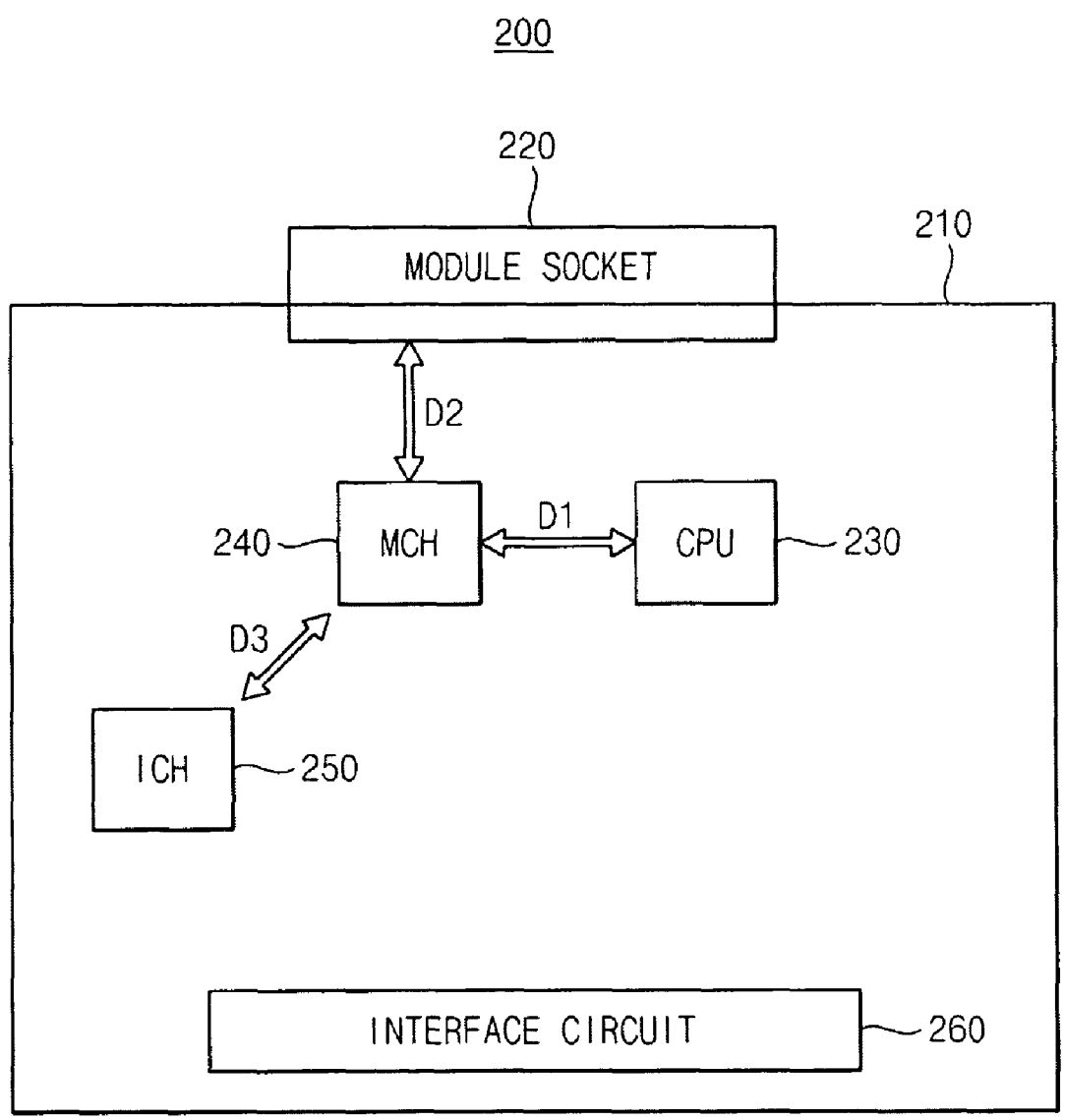
FIG. 5 is a front view of a main board that may be included in the memory mounting test system of FIG. 1.

FIG. 5 is a front view of a main board that may be included in the memory mounting test system of FIG. 1. Referring to FIG. 5, a main board 200 may include a substrate 210, a socket 220, a central processing unit CPU 230, a memory controller MCH 240, an input and output control circuit ICH 250, and an interface circuit 260. The substrate 210 may include a printed circuit board. The socket 220 may be connected to an upper portion of the substrate 210 so that a memory module may be connected with greater ease to the socket 220 for a mounting test. A distance D1 from the central processing unit CPU 230 to the memory controller MCH 240, a distance D2 from the memory controller MCH 240 to the socket 220, and a distance D3 from the memory controller MCH 240 to the input and output control circuit ICH 250 on the main board 200 may be in accordance with standard design guidelines. Therefore, when the socket 220 is connected to an upper portion of the substrate 210 so that the memory module may be connected with greater ease to the socket 220 for a mounting test, the central processing unit CPU 230, the memory controller MCH 240 and the input and output control circuit ICH 250 may be arranged on the substrate 210 such that the distances D1, D2 and D3 satisfy standard design guidelines. The interface circuit 260 which interfaces with external devices may be disposed on a lower portion of the substrate 210.

Figure 6:
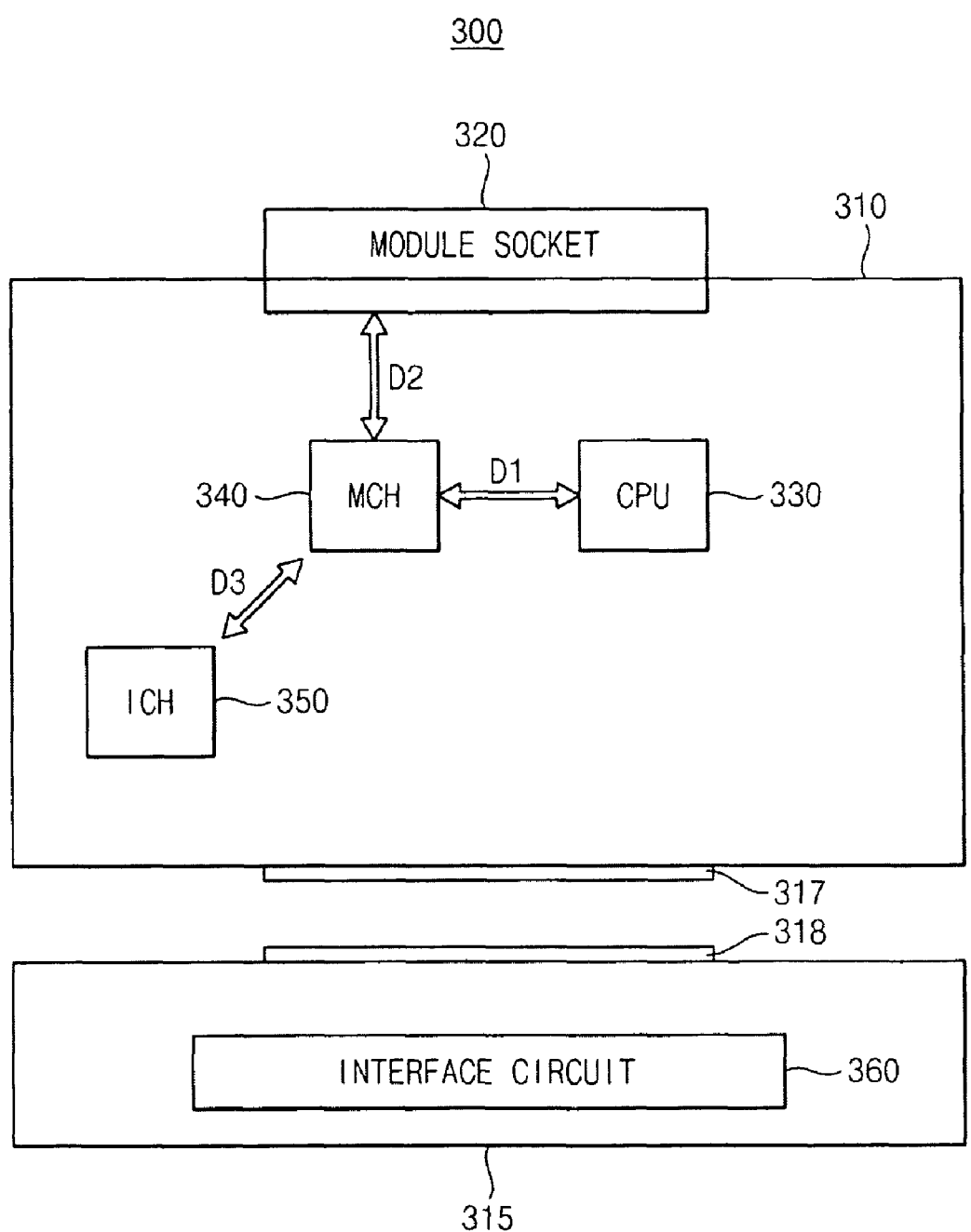
FIG. 6 is a front view of another main board that may be included in the memory mounting test system of FIG. 1.

FIG. 6 is a front view of another main board that may be included in the memory mounting test system of FIG. 1. Referring to FIG. 6, a main board 300 may include a first substrate portion 310, a second substrate portion 315, a socket 320, a central processing unit CPU 330, a memory controller MCH 340, an input and output control circuit ICH 350, and an interface circuit 360. The socket 320, the central processing unit CPU 330, the memory controller MCH 340, and the input and output control circuit ICH 350 may be disposed on the first substrate portion 310, and the interface circuit 360 may be disposed on the second substrate portion 315. The first substrate portion 310 and the second substrate portion 315 may include a printed circuit board. The first substrate portion 310 and the second substrate portion 315 may also be electrically connected through connectors 317 and 318. The first substrate portion 310 and the second substrate portion 315 may be physically separated from each other. The socket 320 may be connected to an upper portion of the first substrate portion 310 so that a memory module may be connected with greater ease to the socket 320 for a mounting test. A distance D1 from the central processing unit CPU 330 to the memory controller MCH 340, a distance D2 from the memory controller MCH 340 to the socket 320, and a distance D3 from the memory controller MCH 340 to the input and output control circuit ICH 350 on the main board 300 may be in accordance with standard design guidelines. Therefore, when the socket 320 is connected to an upper part of the first substrate portion 310 so that the memory module may be connected with greater ease to the socket 320 for a mounting test, the central processing unit CPU 330, the memory controller MCH 340, and the input and output control circuit ICH 350 may be arranged on the first substrate portion 310 such that the distances D1, D2, and D3 satisfy standard design guidelines. The interface circuit 360 which interfaces with external devices may be disposed on the second substrate portion 315.

Figure 7:
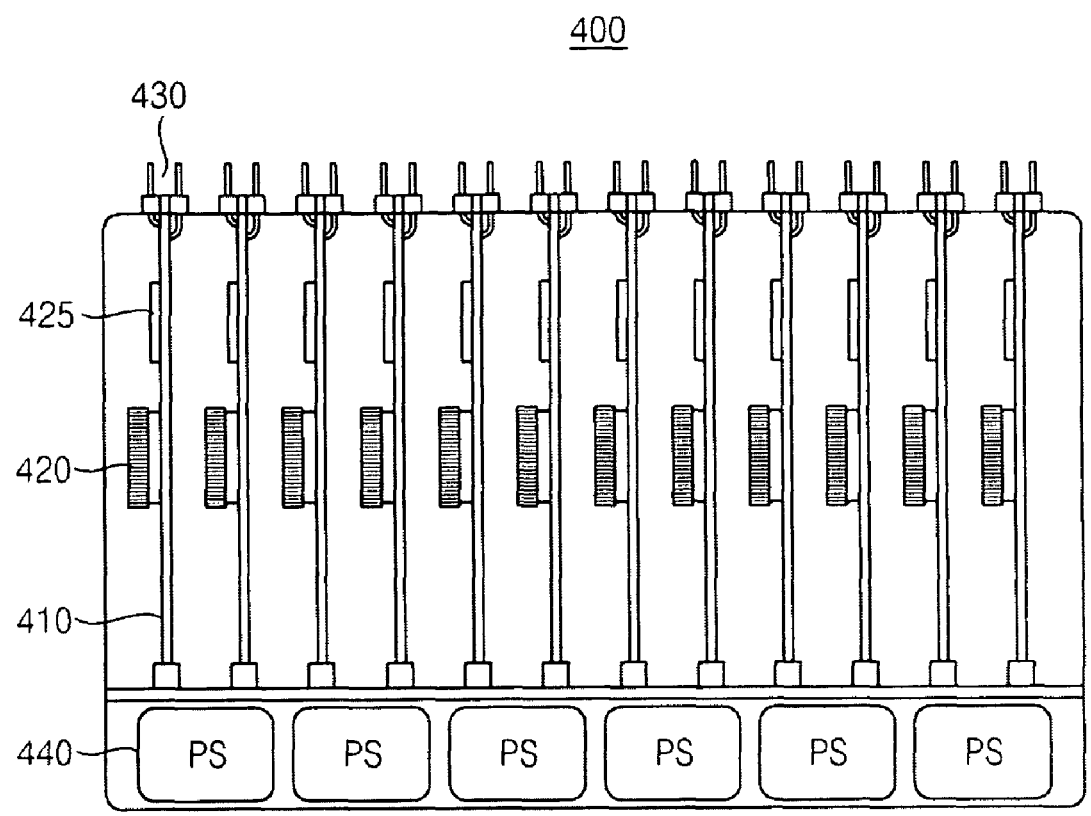
FIG. 7 is a diagram illustrating a memory mounting test system according to example embodiments.

FIG. 7 is a diagram illustrating a memory mounting test system according to example embodiments. Referring to FIG. 7, a memory mounting test system 400 may include a plurality of main boards, each of which has a substrate 410, a connector 420, a central processing unit 425, and a socket 430 for connecting a memory module. The plurality of main boards may be vertically arranged at regular intervals. The socket 430 may directly connect a memory module to the substrate 410 in a direction parallel to the substrate 410. The connector 420 may receive an address signal, a control signal, and/or a data signal used in performing a mounting test for memory modules connected to the plurality of main boards from external devices. The memory mounting test system 400 may provide the address signal, the control signal, and/or the data signal received through the connector 420 to the memory modules. The memory mounting test system 400 may further include a plurality of power supplies PS 440. Each of the plurality of power supplies 440 may be connected to each of the plurality of main boards, respectively. Alternatively, each of the plurality of power supplies 440 may be connected to two or more of the plurality of main boards.

Figure 8:
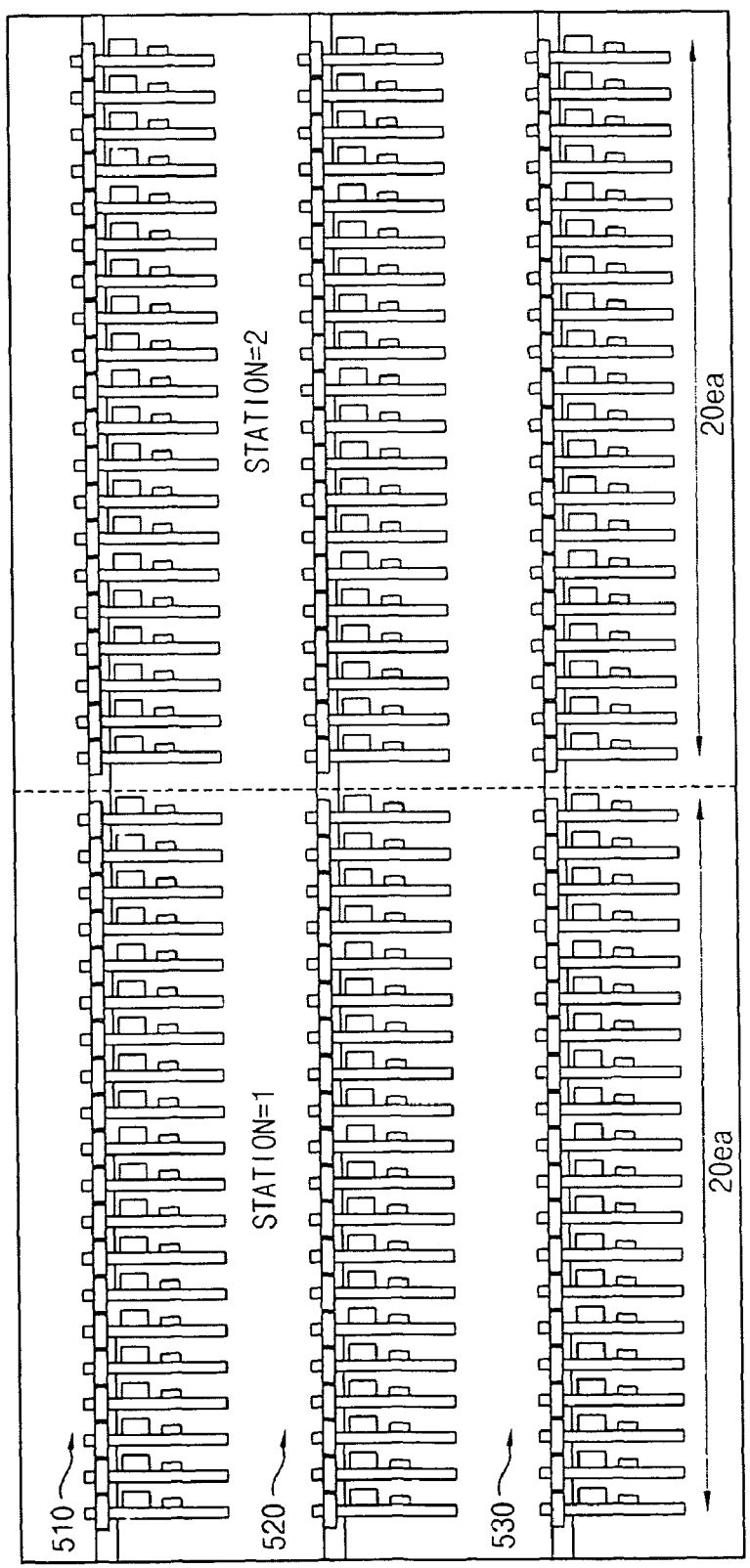
FIGS. 8 and 9 are diagrams illustrating a memory mounting test system having three rows and two columns according to example embodiments.
Figure 9:
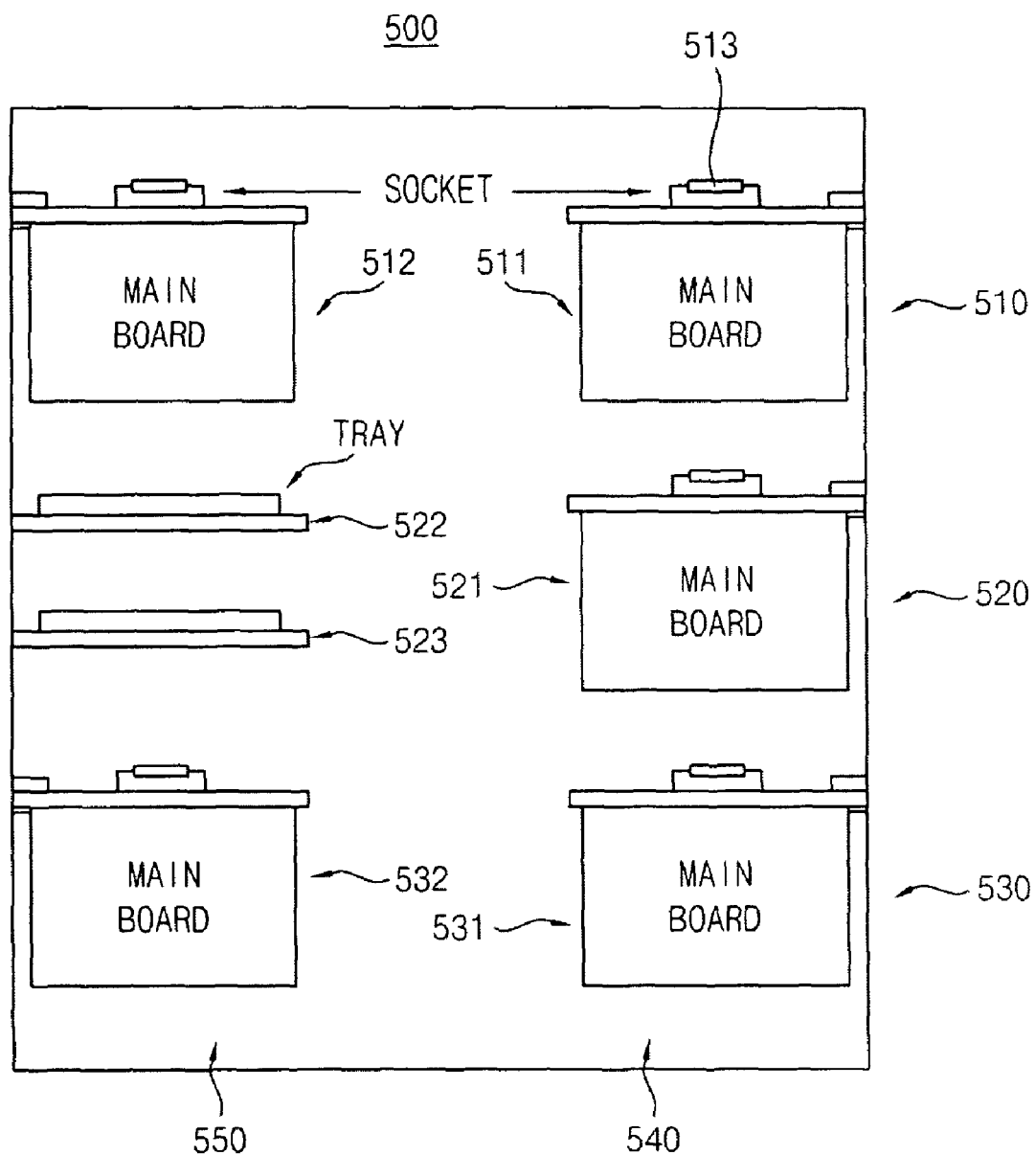

FIG. 8 illustrates a front view of a memory mounting test system having three rows and two columns according to example embodiments. FIG. 9 illustrates a side view of the memory mounting test system of FIG. 8. In particular, FIG. 9 represents a view from I to I' of FIG. 8. Referring to FIGS. 8 and 9, a memory mounting test system 500 may include a first row 510, a second row 520, a third row 530, a first column 540, and a second column 550. Each of the rows 510, 520, and 530 may include a first station and a second station. For example, twenty main boards may be arranged in each station. In such an example, forty main boards may be arranged in the first column 540 of each of the rows 510, 520, and 530. Forty main boards may be arranged in the second column 550 of the first row 510 and the third row 530. Main boards may not be arranged in the second column 550 of the second row 520. Instead, trays 522 and 523 may be arranged in the second column 550 of the second row 520. Therefore, eighty main boards may be arranged in the first row 510 and the third row 530, while forty main boards may be arranged in the second row 520 in total. A main board 511 may be arranged in the first column 540 of the first row 510, a main board 521 may be arranged in the first column 540 of the second row 520, a main board 531 may be arranged in the first column 540 of the third row 530, a main board 512 may be arranged in the second column 550 of the first row 510, the trays 522 and 523 may be arranged in the second column 550 of the second row 520, and a main board 532 may be arranged in the second column 550 of the third row 530. Each of the main boards may include a socket 513 for connecting a memory module. As illustrated in FIGS. 8 and 9, the memory mounting test system 500 including the plurality of main boards may occupy a relatively small space, because each of the plurality of main boards has the socket 513 directly connecting a memory module to a respective main board in a direction parallel to the main boards.

FIGS. 10A, 10B, 11A, 11B, 12A, 12B, 12C, and 12D are diagrams illustrating electrical connections between a memory controller and a memory module having two ranks for a more efficient mounting test according to example embodiments. A memory mounting test system according to example embodiments may adopt a rank parallel test board (PTB) feature. A rank PTB feature represents a method of testing a memory module by treating a memory module having two or more ranks as a memory module having one rank.

Figure 10A:
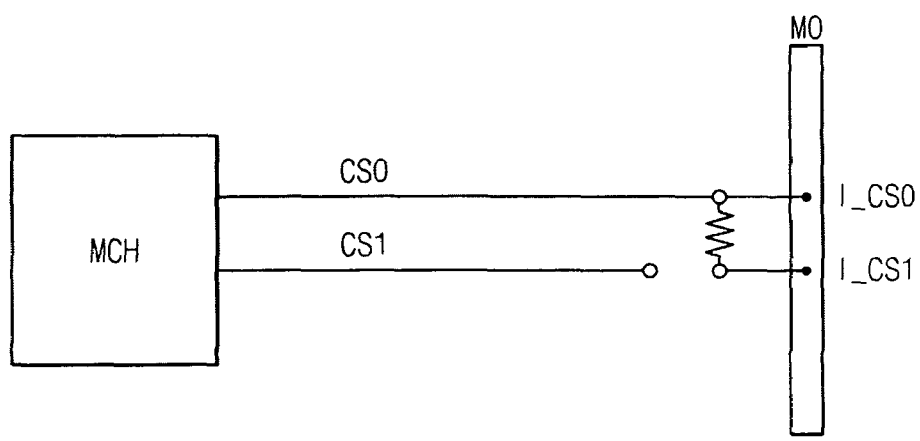
FIGS. 10A, 10B, 11A, 11B, 12A, 12B, 12C, and 12D are diagrams illustrating electrical connections between a memory controller and a memory module having two ranks for a more efficient mounting test according to example embodiments.

Referring to FIG. 10A, a memory controller MCH may generate a first chip selection signal CS0 for a first rank of a memory module MO and a second chip selection signal CS1 for a second rank of the memory module MO. The memory module MO may include a first input I_CS0 connected to the first rank of the memory module MO and configured to receive the first chip selection signal CS0 in a normal mode, and a second input I_CS1 connected to the second rank of the memory module MO and configured to receive the second chip selection signal CS1 in the normal mode. As illustrated in FIG. 10A, in a rank PTB mode during which a mounting test for the memory module MO is performed using a rank PTB feature, the first input I_CS0 and the second input I_CS1 may be electrically connected to each other so that both the first input I_CS0 and the second input I_CS1 receive the first chip selection signal CS0.

Figure 10B:
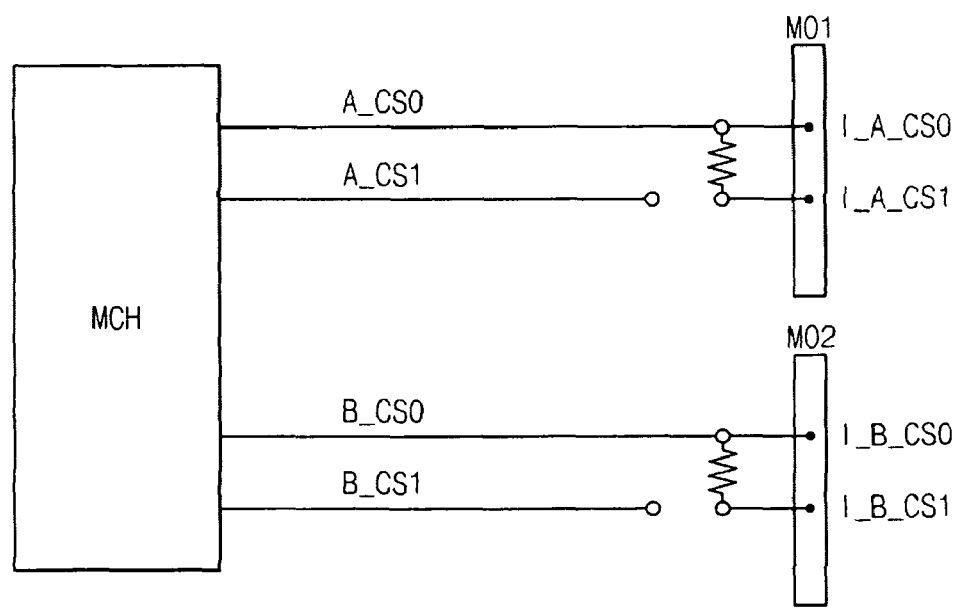

Referring to FIG. 10B, when a main board includes a first socket on the front surface of the main board and a second socket on the back surface of the main board, and a first memory module MO1 is connected to the first socket and a second memory module MO2 is connected to the second socket (e.g., as illustrated in FIG. 4), the memory controller MCH may generate a first chip selection signal A_CS0 for a first rank of the first memory module MO1, a second chip selection signal A_CS1 for a second rank of the first memory module MO1, a third chip selection signal B_CS0 for a first rank of the second memory module MO2, and a fourth chip selection signal B_CS1 for a second rank of the second memory module MO2. The first memory module MO1 may include a first input I_A_CS0 connected to the first rank of the first memory module MO1 and configured to receive the first chip selection signal A_CS0 in the normal mode, and a second input I_A_CS1 connected to the second rank of the first memory module MO1 and configured to receive the second chip selection signal A_CS1 in the normal mode. The second memory module MO2 may include a third input I_B_CS0 connected to the first rank of the second memory module MO2 and configured to receive the third chip selection signal B_CS0 in the normal mode, and a fourth input I_B_CS1 connected to the second rank of the second memory module MO2 and configured to receive the fourth chip selection signal B_CS1 in the normal mode. As illustrated in FIG. 10B, in the rank PTB mode during which a mounting test for the first memory module MO1 and the second memory module MO2 is performed using a rank PTB feature, the first input I_A_CS0 and the second input I_A_CS1 of the first memory module MO1 may be electrically connected to each other so that both the first input I_A_CS0 and the second input I_A_CS1 receive the first chip selection signal A_CS0, and the third input I_B_CS0 and the fourth input I_B_CS1 of the second memory module MO2 may be electrically connected to each other so that both the third input I_B_CS0 and the fourth input I_B_CS1 receive the third chip selection signal B_CS0.

Figure 11A:
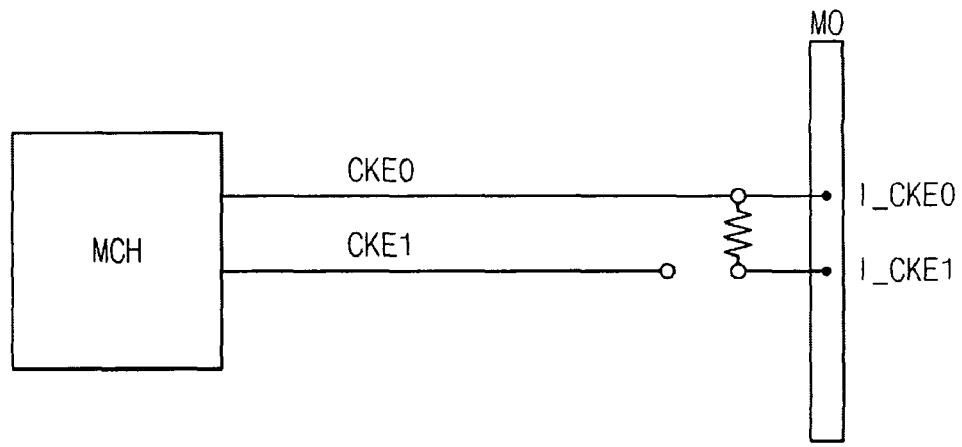

Referring to FIG. 11A, a memory controller MCH may generate a first clock enable signal CKE0 for a first rank of a memory module MO and a second clock enable signal CKE1 for a second rank of the memory module MO. The memory module MO may include a first input I_CKE0 connected to the first rank of the memory module MO and configured to receive the first clock enable signal CKE0 in the normal mode, and a second input I_CKE1 connected to the second rank of the memory module MO and configured to receive the second clock enable signal CKE1 in the normal mode. As illustrated in FIG. 11A, in the rank PTB mode during which a mounting test for the memory module MO is performed using a rank PTB feature, the first input I_CKE0 and the second input I_CKE1 may be electrically connected to each other so that both the first input I_CKE0 and the second input I_CKE1 receive the first clock enable signal CKE0.

Figure 11B:
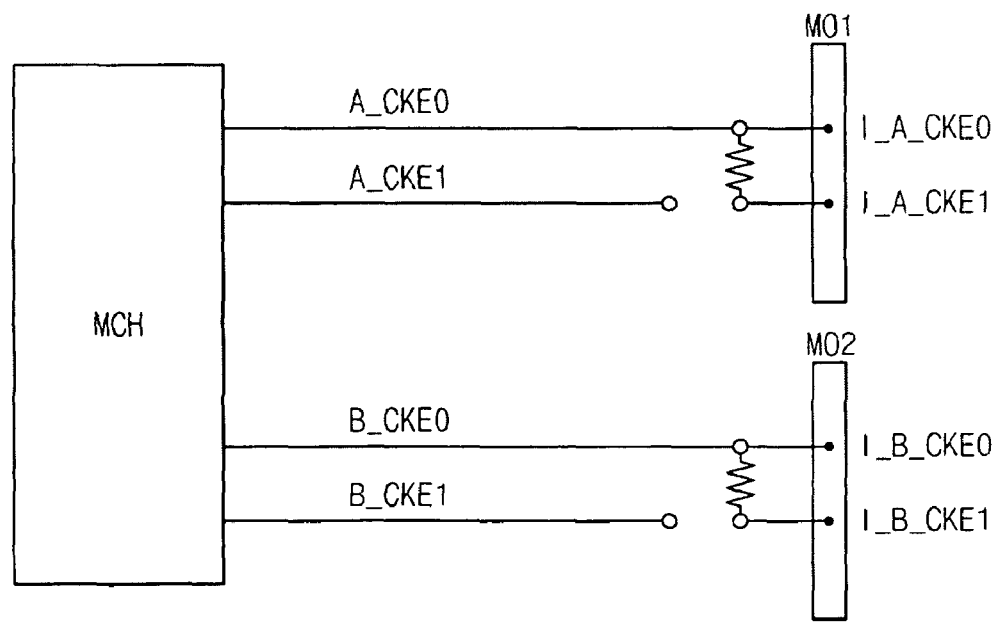

Referring to FIG. 11B, when a main board includes a first socket on the front surface of the main board and a second socket on the back surface of the main board, and a first memory module MO1 is connected to the first socket and a second memory module MO2 is connected to the second socket (e.g., as illustrated in FIG. 4), the memory controller MCH may generate a first clock enable signal A_CKE0 for a first rank of the first memory module MO1, a second clock enable signal A_CKE1 for a second rank of the first memory module MO1, a third clock enable signal B_CKE0 for a first rank of the second memory module MO2, and a fourth clock enable signal B_CKE1 for a second rank of the second memory module MO2. The first memory module MO1 may include a first input I_A_CKE0 connected to the first rank of the first memory module MO1 and configured to receive the first clock enable signal A_CKE0 in the normal mode, and a second input I_A_CKE1 connected to the second rank of the first memory module MO1 and configured to receive the second clock enable signal A_CKE1 in the normal mode. The second memory module MO2 may include a third input I_B_CKE0 connected to the first rank of the second memory module MO2 and configured to receive the third clock enable signal B_CKE0 in the normal mode, and a fourth input I_B_CKE1 connected to the second rank of the second memory module MO2 and configured to receive the fourth clock enable signal B_CKE1 in the normal mode. As illustrated in FIG. 11B, in the rank PTB mode during which a mounting test for the first memory module MO1 and the second memory module MO2 is performed using a rank PTB feature, the first input I_A_CKE0 and the second input I_A_CKE1 of the first memory module MO1 may be electrically connected to each other so that both the first input I_A_CKE0 and the second input I_A_CKE1 receive the first clock enable signal A_CKE0, and the third input I_B_CKE0 and the fourth input I_B_CKE1 of the second memory module MO2 may be electrically connected to each other so that both the third input I_B_CKE0 and the fourth input I_B_CKE1 receive the third clock enable signal B_CKE0.

Figure 12A:
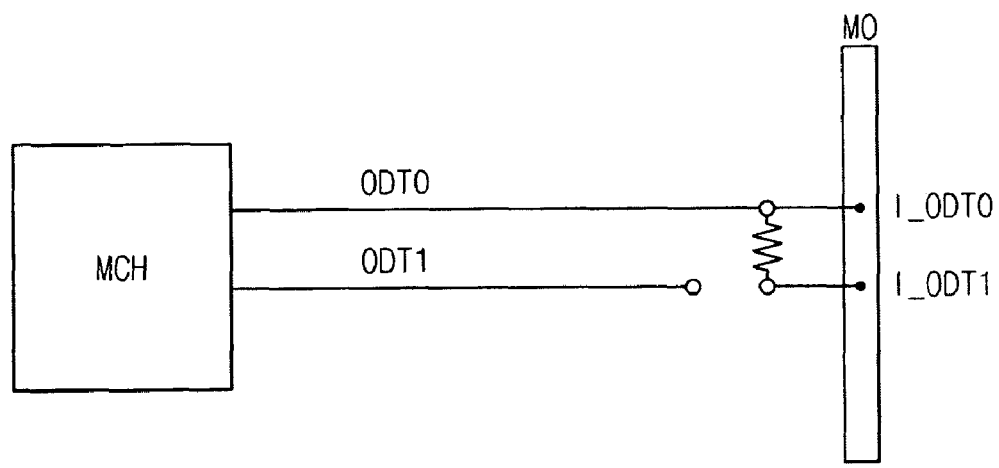
Figure 12B:
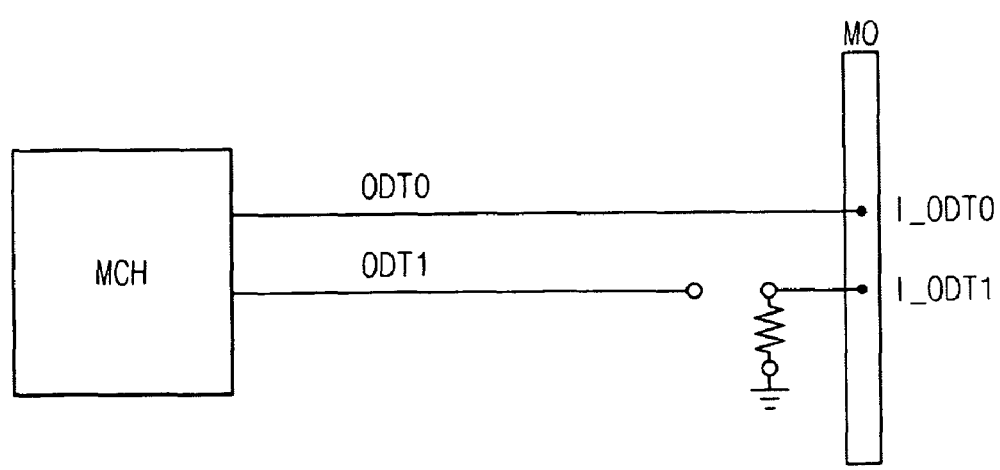

Referring to FIGS. 12A and 12B, a memory controller MCH may generate a first on die termination signal ODT0 for a first rank of a memory module MO and a second on die termination signal ODT1 for a second rank of the memory module MO. The memory module MO may include a first input I_ODT0 connected to the first rank of the memory module MO and configured to receive the first on die termination signal ODT0 in the normal mode, and a second input I_ODT1 connected to the second rank of the memory module MO and configured to receive the second on die termination signal ODT1 in the normal mode. As illustrated in FIG. 12A, in the rank PTB mode during which a mounting test for the memory module MO is performed using a rank PTB feature, the first input I_ODT0 and the second input I_ODT1 may be electrically connected to each other so that both the first input I_ODT0 and the second input I_ODT1 receive the first on die termination signal ODT0. Alternatively, as illustrated in FIG. 12B, in the rank PTB mode during which a mounting test for the memory module MO is performed using a rank PTB feature, the first input I_ODT0 may receive the first on die termination signal ODT0 and the second input I_ODT1 may be connected to ground.

Figure 12C:
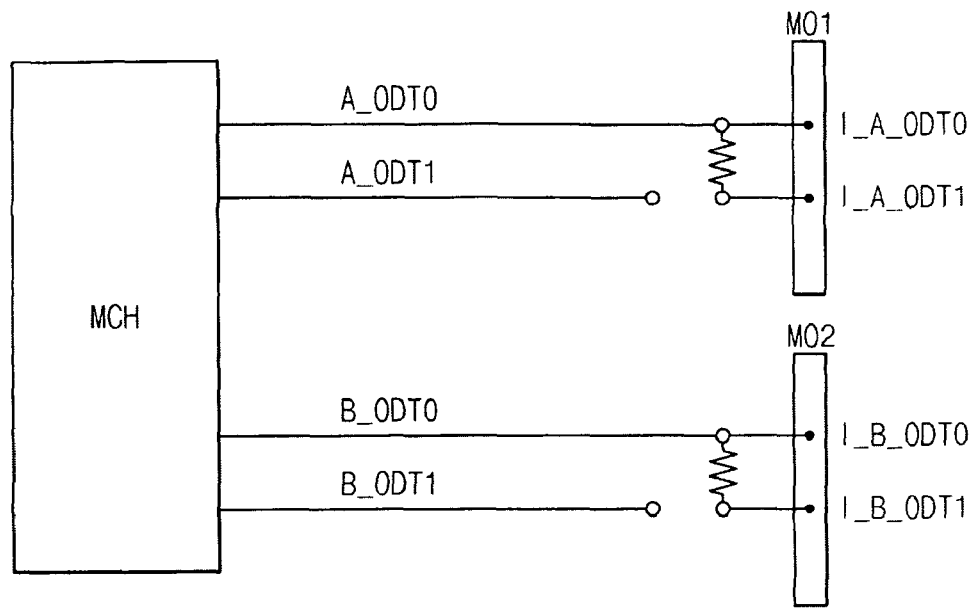
Figure 12D:
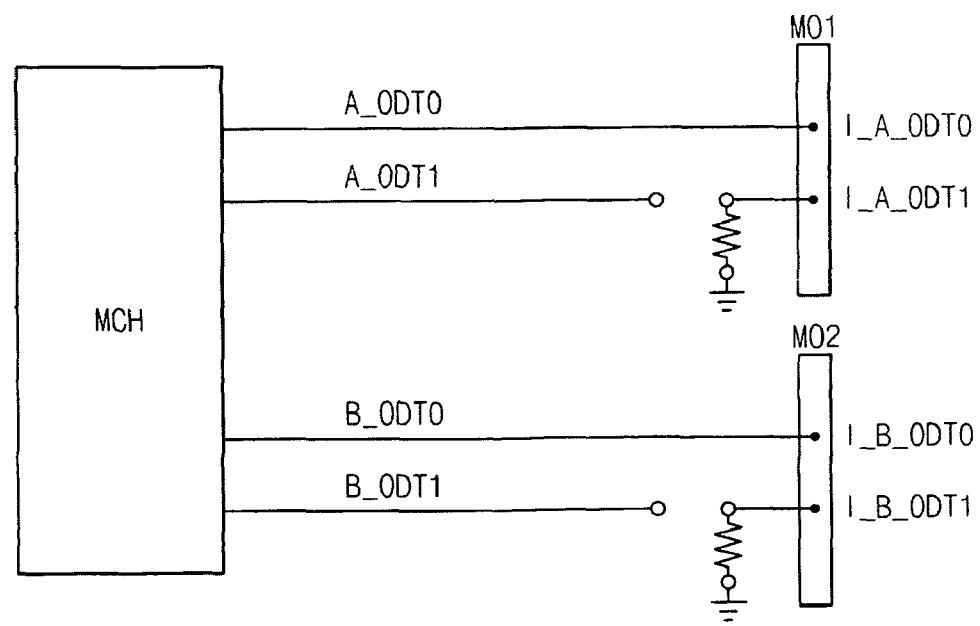

Referring to FIGS. 12C and 12D, when a main board includes a first socket on the front surface of the main board and a second socket on the back surface of the main board, and a first memory module MO1 is connected to the first socket and a second memory module MO2 is connected to the second socket (e.g., as illustrated in FIG. 4), the memory controller MCH may generate a first on die termination signal A_ODT0 for a first rank of the first memory module MO1, a second on die termination signal A_ODT1 for a second rank of the first memory module MO1, a third on die termination signal B_ODT0 for a first rank of the second memory module MO2, and a fourth on die termination signal B_ODT1 for a second rank of the second memory module MO2. The first memory module MO1 may include a first input I_A_ODT0 connected to the first rank of the first memory module MO1 and configured to receive the first on die termination signal A_ODT0 in the normal mode, and a second input I_A_ODT1 connected to the second rank of the first memory module MO1 and configured to receive the second on die termination signal A_ODT1 in the normal mode. The second memory module MO2 may include a third input I_B_ODT0 connected to the first rank of the second memory module MO2 and configured to receive the third on die termination signal B_ODT0 in the normal mode, and a fourth input I_B_ODT1 connected to the second rank of the second memory module MO2 and configured to receive the fourth on die termination signal B_ODT1 in the normal mode.

As illustrated in FIG. 12C, in the rank PTB mode during which a mounting test for the first memory module MO1 and the second memory module MO2 is performed using a rank PTB feature, the first input I_A_ODT0 and the second input I_A_ODT1 of the first memory module MO1 may be electrically connected to each other so that both the first input I_A_ODT0 and the second input I_A_ODT1 receive the first on die termination signal A_ODT0, and the third input I_B_ODT0 and the fourth input I_B_ODT1 of the second memory module MO2 may be electrically connected to each other so that both the third input I_B_ODT0 and the fourth input I_B_ODT1 receive the third on die termination signal B_ODT0. Alternatively, as illustrated in FIG. 12D, in the rank PTB mode during which a mounting test for the first memory module MO1 and the second memory module MO2 is performed using a rank PTB feature, the first input I_A_ODT0 may receive the first on die termination signal A_ODT0 and the second input I_A_ODT1 may be connected to ground, and the third input I_B_ODT0 may receive the third on die termination signal B_ODT0 and the fourth input I_B_ODT1 may be connected to ground.

An unused pin (i.e., NC pin) of the input and output control circuit ICH may be used to select between the normal mode and the rank PTB mode. BIOS of a computer system including the memory mounting test system may determine whether the normal mode is selected or the rank PTB mode is selected using the unused pin of the input and output control circuit ICH when the computer is booted up. A mounting test time for a memory module having two ranks in the rank PTB mode may be reduced by half compared to a mounting test time for the memory module having two ranks in the normal mode, because the memory module having two ranks is treated as a memory module having one rank in the rank PTB mode.

As described above, a main board according to example embodiments may include a socket directly connecting a memory module to a substrate in a direction parallel to the substrate. The socket may be connected to the front surface of the substrate, to the back surface of the substrate, or to both of the front surface and the back surface of the substrate. A memory mounting test system including a plurality of main boards according to example embodiments may occupy a smaller space, because a plurality of memory modules is connected to the plurality of main boards in a direction parallel to the main boards. A memory mounting test system including a plurality of main boards according to example embodiments may perform a mounting test by treating a memory module having two or more ranks as a memory module having one rank. Therefore, a mounting test time may be reduced. Example embodiments of the present inventive concept may be used in a memory mounting test system which uses a main board.

The foregoing is illustrative of the present inventive concept and is not to be construed as limiting thereof. Although various example embodiments have been described, those skilled in the art will readily appreciate that many modifications and variations are possible without materially departing from the novel teachings and advantages of the present inventive concept. Accordingly, all such modifications and variations are intended to be included within the scope of the present inventive concept as defined in the claims. Therefore, it is to be understood that the foregoing is merely illustrative of various embodiments and is not to be construed as limited to the specific examples disclosed, and that modifications to the disclosed example embodiments, as well as other suitable embodiments, are intended to be included within the scope of the appended claims.

What is claimed is:

1. A memory mounting test system, comprising:
a plurality of main boards, each of the plurality of main boards including a substrate and at least one socket configured to connect a memory module to the substrate in a direction parallel to the substrate; and
a test circuit electrically connected to the plurality of main boards and configured to perform a mounting test by applying an address signal, a control signal, and a data signal to the plurality of main boards,
wherein the memory module has two or more ranks but is configured as having one rank during the mounting test.

2. The memory mounting test system of claim 1, wherein the memory module includes a first input, a second input, a third input, and a fourth input, the first input and second input being connected to each other, and the third input and fourth input being connected to each other during a rank parallel test board (PTB) mode, and
wherein the first input is connected to a first rank and configured to receive a chip selection signal for the first rank, the second input is connected to a second rank and configured to receive a chip selection signal for the second rank, the third input is connected to the first rank and configured to receive a clock enable signal for the first rank, and the fourth input is connected to the second rank and configured to receive a clock enable signal for the second rank during a normal mode.

3. The memory mounting test system of claim 2, wherein the memory module further includes a fifth input and a sixth input, the fifth input and sixth input being connected to each other during the rank parallel test board mode, and
wherein the fifth input is connected to the first rank and configured to receive an on die termination signal for the first rank and the sixth input is connected to the second rank and configured to receive an on die termination signal for the second rank during the normal mode.

4. The memory mounting test system of claim 2, wherein the memory module further includes a fifth input and a sixth input, with one of the fifth input and sixth input being connected to ground during the rank parallel test board mode, and
wherein the fifth input is connected to the first rank and configured to receive an on die termination signal for the first rank and the sixth input is connected to the second rank and configured to receive an on die termination signal for the second rank during the normal mode.

5. A memory mounting test system, comprising:
a plurality of main boards, each of the plurality of main boards including a substrate and at least one socket configured to connect a memory module to the substrate in a direction parallel to the substrate, each of the plurality of main boards further including a connector configured to receive an address signal, a control signal, and a data signal from external devices for performance of a mounting test; and
a plurality of power supplies configured to provide power to the plurality of main boards,
wherein the memory module has two or more ranks but is configured as having one rank during the mounting test.

6. The memory mounting test system of claim 5, wherein each of the plurality of power supplies is connected to at least one of the plurality of main boards.

7. The memory mounting test system of claim 5, wherein the memory module includes a first input, a second input, a third input, and a fourth input, the first input and second input being connected to each other, and the third input and fourth input being connected to each other during a rank parallel test board mode, and
wherein the first input is connected to a first rank and configured to receive a chip selection signal for the first rank, the second input is connected to a second rank and configured to receive a chip selection signal for the second rank, the third input is connected to the first rank and configured to receive a clock enable signal for the first rank, and the fourth input is connected to the second rank and configured to receive a clock enable signal for the second rank during a normal mode.

8. The memory mounting test system of claim 7, wherein the memory module further includes a fifth input and a sixth input, the fifth input and sixth input being connected to each other during the rank parallel test board mode, and
wherein the fifth input is connected to the first rank and configured to receive an on die termination signal for the first rank and the sixth input is connected to the second rank and configured to receive an on die termination signal for the second rank during the normal mode.

9. The memory mounting test system of claim 7, wherein the memory module further includes a fifth input and a sixth input, with one of the fifth input and sixth input being connected to ground during the rank parallel test board mode, and
wherein the fifth input is connected to the first rank and configured to receive an on die termination signal for the first rank and the sixth input is connected to the second rank and configured to receive an on die termination signal for the second rank during the normal mode.

* * * * *